United States Patent [19]
Tsukagoshi et al.

[11] Patent Number: 5,804,882
[45] Date of Patent: Sep. 8, 1998

[54] SEMICONDUCTOR DEVICE HAVING A SEMICONDUCTOR CHIP ELECTRICALLY CONNECTED TO A WIRING SUBSTRATE

[75] Inventors: Isao Tsukagoshi, Shimodate; Hiroshi Matsuoka, Oyama; Yukihisa Hirosawa, Mooka; Yoshikatsu Mikami, Shimodate; Hisashi Dokochi, Mito, all of Japan

[73] Assignee: Hitachi Chemical Company, Ltd., Tokyo, Japan

[21] Appl. No.: 651,954

[22] Filed: May 21, 1996

[30] Foreign Application Priority Data

May 22, 1995 [JP] Japan ................... 7-122026

[51] Int. Cl.⁶ .............. H01L 13/12; H01L 23/48
[52] U.S. Cl. .......... 257/783; 257/780; 257/728; 257/777; 257/690; 257/737; 257/738
[58] Field of Search ................. 257/690, 735, 257/737, 738, 783, 780, 778, 777, 785, 687, 688, 726, 727, 779

[56] References Cited

U.S. PATENT DOCUMENTS

| | | | |
|---|---|---|---|
| 3,811,186 | 5/1974 | Larnerd et al. | 29/626 |
| 3,893,156 | 7/1975 | Riseman | 257/778 |
| 4,908,689 | 3/1990 | McBride et al. | 257/738 |
| 5,214,308 | 5/1993 | Nishiguchi et al. | 257/738 |
| 5,220,200 | 6/1993 | Blanton | 257/780 |
| 5,283,446 | 2/1994 | Tanisawa | 257/737 |
| 5,329,423 | 7/1994 | Scholz | 257/738 |
| 5,352,318 | 10/1994 | Takabayashi et al. | 156/272.6 |
| 5,394,490 | 2/1995 | Kato et al. | 257/778 |
| 5,477,087 | 12/1995 | Kawakita et al. | 257/737 |
| 5,508,561 | 4/1996 | Tago et al. | 257/738 |
| 5,559,316 | 9/1996 | Tomada | 257/738 |
| 5,578,874 | 11/1996 | Kurogi et al. | 257/779 |
| 5,583,378 | 12/1996 | Marrs et al. | 257/730 |
| 5,600,180 | 2/1997 | Kusaka et al. | 257/737 |
| 5,612,573 | 3/1997 | Lewis et al. | 257/779 |
| 5,616,958 | 4/1997 | Laine et al. | 257/783 |
| 5,629,566 | 5/1997 | Doi et al. | 257/778 |
| 5,633,535 | 5/1997 | Chao et al. | 257/778 |

FOREIGN PATENT DOCUMENTS

| | | | |
|---|---|---|---|
| 0475519 | 3/1992 | European Pat. Off. | |
| 4020048 | 1/1992 | Germany. | |
| 63-275128 | 11/1988 | Japan. | |
| 1-158743 | 6/1989 | Japan | 257/738 |
| 1-201932 | 8/1989 | Japan | 257/737 |
| 2-133936 | 5/1990 | Japan. | |
| 6-112207 | 4/1994 | Japan | 257/738 |

OTHER PUBLICATIONS

Patent Abstracts of Japan, vol. 17, No. 432 (E–1411) 10 Aug. 1993 & JP–A–05 090340 (Matsushita) 9 Apr. 1993—Abstract.

Patent Abstracts of Japan, vol. 18, No. 199 (E–1534), 7 Apr. 1994 & JP–A–06 005735 (Sony) 14 Jan. 1994—Absract.

*Primary Examiner*—Tom Thomas
*Assistant Examiner*—Alexander Oscar Williams
*Attorney, Agent, or Firm*—Antonelli, Terry, Stout & Kraus, LLP

[57] ABSTRACT

A semiconductor device comprising a semiconductor chip, a wiring substrate, and an adhesive preferably containing electroconductive particles interposed therebetween, a plurality of spacer elements being present on or below the adhesive layer, said spacer elements having almost the same height as surrounding projecting electrodes and at least one shape selected from circles and polygons when viewed from the top, within an area surrounded by the connected electrodes, has a high flexural strength and high reliability and can be used for information cards, and the like.

20 Claims, 3 Drawing Sheets

5,804,882

SEMICONDUCTOR DEVICE HAVING A SEMICONDUCTOR CHIP ELECTRICALLY CONNECTED TO A WIRING SUBSTRATE

BACKGROUND OF THE INVENTION

This invention relates to a semiconductor device comprising a semiconductor chip electrically connected to a wiring substrate, and a wiring substrate used therein.

As a method for electrically connecting a semiconductor chip and a wiring substrate, it is known to adhere a semiconductor chip to a wiring substrate having electrodes corresponding to those of the semiconductor chip via an adhesive by applying pressure or heat and pressure so as to obtain electrical connection between the electrodes. In such a case, as an adhesive, there is used an insulating adhesive which directly contacts both electrodes to obtain electrical conductivity or an anisotropically electroconductive adhesive having electroconductive particles which give electrical conductivity in the thickness direction by applying pressure when electroconductive particles are present between both electrodes.

Recently, attempts have been made to reduce the thickness of semiconductor chips, for example, reducing the thickness of electronic parts in IC cards, liquid crystal display devices, etc. so as to improve portability and easiness in operation. For example, as thin electronic parts, the thickness of a prepaid card is about 0.25 mm, and the thickness of bar code label is about 0.15 mm, etc. These electronic parts become thinner and thinner, now. Thus, the thickness of semiconductor chips used therefor are now reduced from about 0.6 mm to, for example, about 0.3 mm, or in an extreme case, a thickness of about 0.62 mm is studied.

In such cases, when an adhesive present between the semiconductor chip and the wiring substrate is pressed or pressed with heating, warpage of the chip occurs, resulting in lowering the connection reliability remarkably. Further, since the central portion of the semiconductor chip is easily deformed at the time of connection, residual stress causes lowering of adhesive strength and produces insufficient blexural strength, resulting in thin electronic parts which are difficult to carry.

On the other hand, when the semiconductor chip is reduced in thickness, its flexibility increases so as to make the-chip more deformable during carrying. But, when adhesive defects caused by, for example, generation of bubbles in a portion connected to the substrate occur often, lowering in flexural strength and poor reliability are caused as mentioned above. Further, when the fluidity of the adhesive is insufficient, contact between both electrodes or contact between the electrodes and electroconductive particles becomes insufficient, resulting in low connection resistance.

SUMMARY OF THE INVENTION

It is an object of the present invention to provide a semiconductor device comprising a semiconductor chip electrically connected to a wiring substrate capable of maintaining excellent connection reliability even if the semiconductor chip is thin, and to provide a wiring substrate used therein, thereby overcoming defects of prior art.

The present invention provides a semiconductor device comprising a semiconductor chip having a thickness of 0.3 mm or less and a plurality of electrodes on a peripheral portion, a wiring substrate having a plurality of electrodes corresponding to the electrodes of the semiconductor chip, and an adhesive layer present between the semiconductor chip and the wiring substrate, said electrodes of at least one of the semiconductor chip and the wiring substrate being projected from an insulating plane, a plurality of spacer elements having almost the same height as the projecting electrodes and having at least one shape selected from circles and polygons when seen from a plan view, being present in an area surrounded by the electrodes on the peripheral portion of the semiconductor chip after connection.

The present invention also provides a wiring substrate comprising a substrate, a plurality of projecting electrodes formed on the substrate and corresponding to electrodes on a peripheral portion of a semiconductor chip to be connected to the substrate, and a plurality of spacer elements formed in an area surrounded by the projecting electrodes on the substrate and having almost the same height as the projecting electrodes with at least one shape selected from circles and polygons when seen from a plan view.

The present invention also provides a wiring substrate comprising a substrate, a plurality of electrodes formed on the substrate and corresponding to projecting electrodes on a peripheral portion of a semiconductor chip to be connected to the substrate, and a plurality of spacer elements formed in an area surrounded by the electrodes on the substrate and having almost the same height as the projecting electrodes on the semiconductor with at least one shape selected from circles and polygons when seen from a plan view.

DESCRIPTION OF THE PREFERRED EMBODIMENTS

Figure 1:
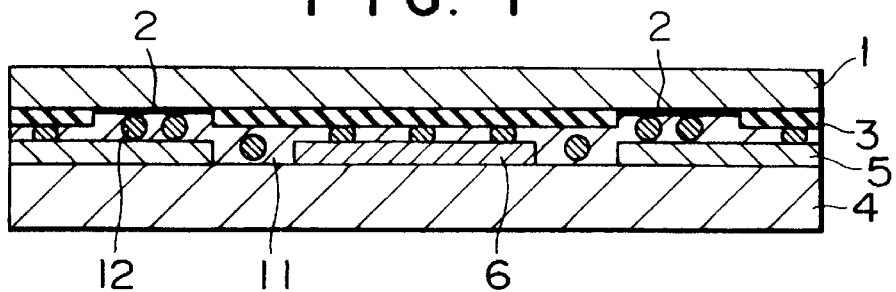
FIG. 1 is a schematic cross-sectional view of a semiconductor device according to one embodiment of the present invention.

According to the present invention, there is provided a semiconductor device comprising a semiconductor chip having a thickness of 0.3 mm or less and a plurality of electrodes on a peripheral portion of the chip, a wiring substrate having a plurality of electrodes corresponding to the electrodes of semiconductor chip, and an adhesive layer present between the semiconductor chip and the wiring substrate; said electrodes of at least one of the semiconductor chip and the wiring substrate being extended outwardly from an insulating plane to form projecting electrodes, a plurality of spacer elements having almost the same height as the projecting electrodes and having at least one shape selected from circles and polygons, when viewed from the top, being present in an area surrounded by the electrodes on the peripheral portion of the semiconductor chip after connection.

As to the shape of spacer elements of this invention, the term "circles" imply a circle, an ellipse, an oval, a semicircle, an arc, etc. and the term "polygons" imply a triangle, a square, a rectangle, a lozenge, a pentagon, a hexagon, a linear form, an L-shaped form, a U-shaped form, a V-shaped form, etc.

In a preferred embodiment, the spacer elements have at least one shape selected from a triangle, L-shaped form, a semi-circular form and a U-shaped form or two or more shapes thereof. It is preferable that the spacer elements are arranged so as to direct each angle and/or closed side to a center of a connected area. The connected area means an area connected by adhesive and surrounded by the electrodes on the substrate which corresponds to electrodes on a peripheral portions of semiconductor chip. As an arrangement, it is preferable that the spacer elements are arranged spokewise from the center of the connected area to the periphery thereof, or are arranged symmetrically to the center of the connected area. Further, the spacer elements may have uneven connecting surfaces and can be electroconductive or insulating.

In addition, the adhesive used for connection preferably contains electroconductive particles which can give electric conductivity only in the thickness direction when pressed, and if necessary may further contain hard particles having a smaller diameter than that of the electroconductive particles, said hard particles acting as filler elements.

According to the present invention, there is also provided a wiring substrate used in such an electrically connected structure as the semiconductor device, comprising a substrate, a plurality of electrodes formed on the substrate and corresponding to electrodes on a peripheral portion of a semiconductor chip to be connected to the substrate, and a plurality of spacer elements formed in an area surrounded by the electrodes on the substrate and having at least one shape selected from circles and polygons when viewed from the top. It is preferable that each angle or closed side of said shape be directed to a center of a connected area. The height of the spacer elements (or dummy electrodes) should be almost the same height as any projecting electrodes on the substrate or the projecting electrodes on the semiconductor chip to be connected.

The present invention is explained referring to the drawings.

FIGS. 1 to 4 are schematic cross-sectional views of a semiconductor device comprising a semiconductor chip electrically connected to a wiring substrate for explaining some embodiments of the present invention. In FIGS. 1 to 4, numeral 1 denotes a semiconductor chip, numeral 2 denotes an electrode on the chip, numeral 3 denotes an insulating layer, numeral 4 denotes a substrate, numeral 5 denotes an electrically conductive circuit on the substrate, numeral 6 or 6' denotes a spacer element (which may be termed a dummy electrode in same instances), numeral 7 denotes a projecting electrode, numeral 11 denotes an adhesive and numeral 12 denotes an electroconductive particle.

Figure 2:
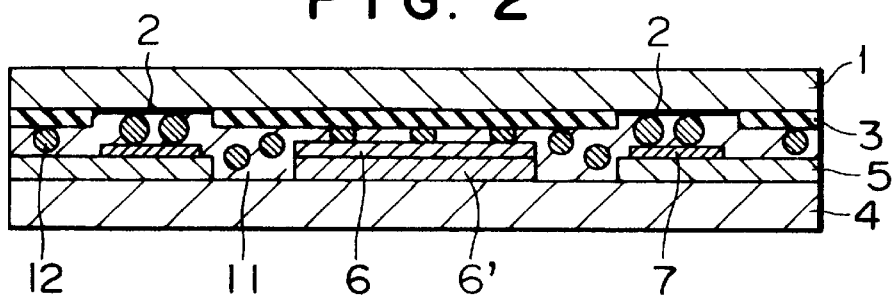
FIG. 2 is a schematic cross-sectional view of a semiconductor device according to another embodiment of the present invention.
Figure 3:
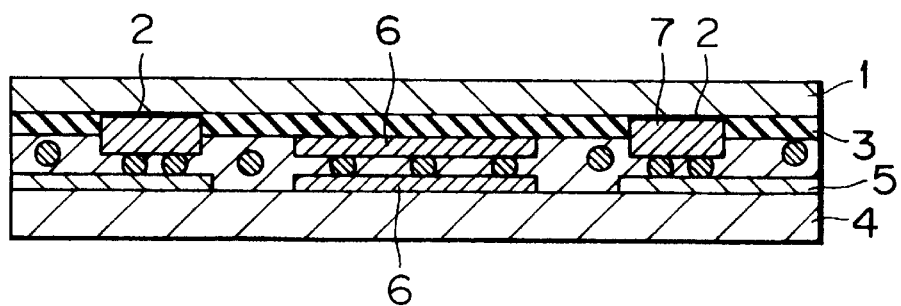
FIG. 3 is a schematic cross-sectional view of a semiconductor device according to a further embodiment of the present invention.
Figure 4:
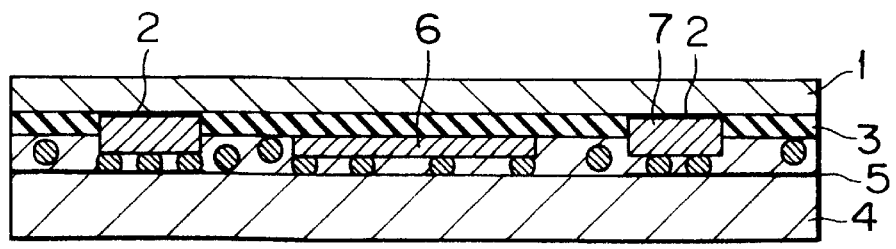
FIG. 4 is a schematic cross-sectional view of a semiconductor device according to a still further embodiment of the present invention.

In FIGS. 1 and 2, a bumpless chip is used as the semiconductor chip 1. In FIGS. 3 and 4, a chip having bumps (i.e. projecting electrodes 7') is used as the semiconductor chip 1.

As mentioned above, there is a tendency to reduce the thickness of the semiconductor chip 1. The present invention is particularly effective when the semiconductor chip is so thin that flexibility of the chip increases.

As the semiconductor chip 1, there can typically be used a chip made of silicon or gallium arsenide. It is also possible to use other similar chips made of other appropriate electronic parts.

As the electrode 2, there can be used aluminum (Al) which is generally used as a wiring on a semiconductor chip 1. It is also possible to use wiring electrodes made of Cu, Au, solder, Cr, Ni, Ag, Mo, Ta, Sn, indium oxide (ITO), an electroconductive ink, etc. These metals can be used singly or as a mixture thereof or in a laminated structure.

On the surface of electrode 2, there is formed the insulating layer 3 made of silicon nitride, silicon oxide, polyimide or the like and usually having a thickness of 5 $\mu$m or less, preferably about 1–2 $\mu$m, so as to expose the electrode 2 in some portions. On the exposed portions of the electrode 2, projecting electrodes 7, often called as bumps, can be formed as shown in FIGS. 3–4. Usually, the height of the projecting electrodes 7 from the surface of the insulating layer 3 is 0.1 to 5 $\mu$m. A chip having no bumps is called, in the present invention, a bumpless chip (see FIGS. 1 and 2). A bumpless chip having exposed electrodes on a peripheral portion of the semiconductor chip 1 is often used, since input and output for the connected substrate is easy. The semiconductor chip usually has a square shape or a rectangle shape, and the term "peripheral portion" means a portion near at least two sides of the chip (e.g. see FIGS. 5C and 5D mentioned below).

The projecting electrodes 7 may be formed on the side of substrate 4 (see FIG. 2), on the side of semiconductor chip 1 (see FIGS. 3–4) or on both sides of the chip 1 and the substrate 4 (not shown in the drawings), or the projecting electrodes can be formed as circuits (e.g. circuit 5 in FIG. 1), terminals, etc. on the substrate. When the projecting electrodes are formed on the substrate 4, the height of the electrodes is preferably 10–35 $\mu$m. The use of bumpless chip is preferable due to omission of some steps in a production process.

As the substrate 4, there ban be used a plastic film made from, for example, polyimide, polyester, etc., a complex of glass * epoxy, etc., a semiconductor of silicon, etc., an inorganic material such as glass, ceramic, etc. The substrate 4 has circuits 5, if necessary via an adhesive (not shown in the drawings).

The material of the circuit 5 is not particularly limited and can be those described for the electrode 2. The thickness of the circuit is usually about 0.1 to 50 $\mu$m. Generally speaking, when the thickness is about 4 or 5 $\mu$m or more, the circuit is usually formed using a copper foil or an electroconductive paint.

When there is no unevenness derived from the substrate 4 or the insulating layer 3, or even if there is unevenness of 4 or 5 $\mu$m or less, the electrodes and the like are typically obtained by an additive method or a thin film method. The material therefor and thickness thereof are selected considering properties such as electrical conductivity, corrosion resistance, and economy, such as production cost, etc.

A plurality of spacer elements 6 are formed on a side to be connected on the substrate 4 (FIGS. 1 and 2), or on the semiconductor chip 1 (FIG. 4), or both (FIG. 3).. The spacer elements are formed in an area at least surrounded by the electrodes 2 on the peripheral portion of the semiconductor chip 1 and have almost the same height as the electrode being projected (e.g. projecting electrodes 7 of FIGS. 2–4, circuit 5 of FIG. 1). The meaning of "almost the same height" is generally ±20%, preferably ±10% of the height of the projecting electrode. The preferable limit of the height of the dummy electrodes 6 is ±5 μm, more preferably ±2 μm, of the height of the projecting electrode. The formation of spacer elements 6 on the side of substrate 4 (FIGS. 1 and 2) is particularly preferable, since the spacer elements can be formed of a metal simultaneously with the formation of the circuit 5 and/or the projecting electrodes 7 by plating or etching used for circuit processing.

Figures 5A, 5B, 5C, 5D:
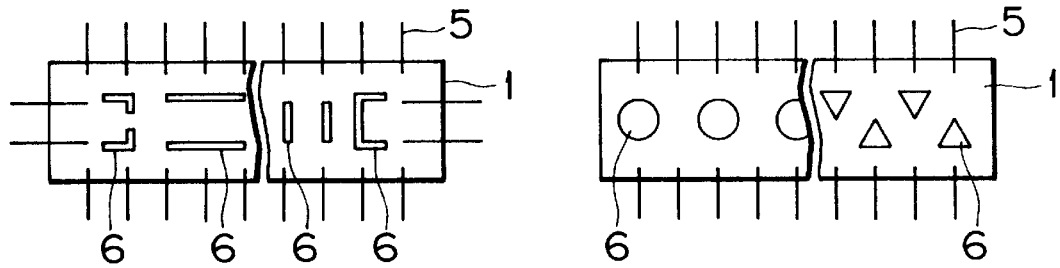
FIGS. 5A to 5D are plane views of dummy electrodes attached to wiring substrates.

The arrangement of a plurality of spacer elements 6 is explained in detail referring to FIGS. 5A–5D and 6A–6F, which are plane views prior to connection of the semiconductor chip. The spacer elements 6 are present separately, when viewed from top, in the shape of at least one of circles and polygons in plural in the connection area. It is possible to form polygons in a linear form (FIGS. 5A and 5B), in a L-shaped form or a U-shaped form (parts of FIGS. 5A and 5B), in a triangle form (FIG. 5D) or in form of circles (FIG. 5C). These shapes can be combined or mixed optionally.

It is important to consider the fluidity of adhesive at the time of connection so as to remove bubbles from the center to peripheral portion of the assembly. Thus, the arrangement of a plurality of spacer elements is important so as to minimize the formation of bubbles in the interior as much as possible. In other words, it is important to arrange the spacer elements so as to make the flow of adhesive smooth from the center to the edge portions of the semiconductor chip 1 during the bonding procedure.

Figure 6A:
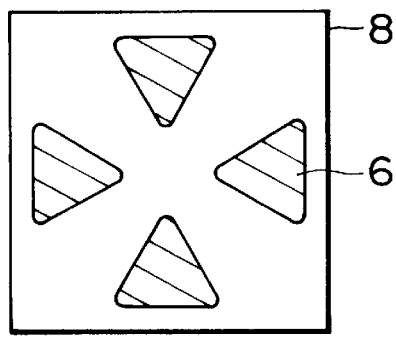
FIGS. 6A to 6F are plane views of dummy electrodes according to embodiments of the present invention.
Figure 6B:
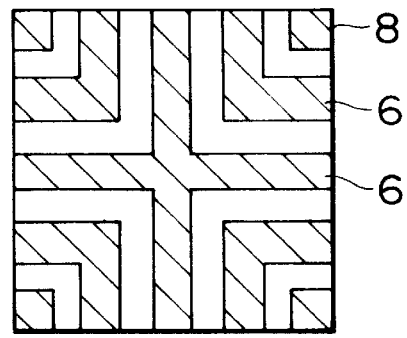
Figure 6C:
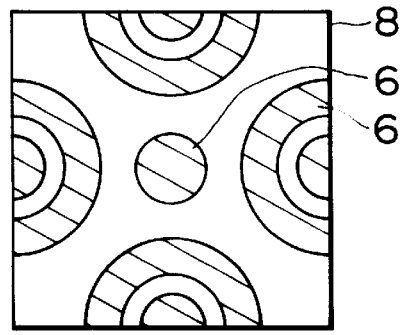
Figure 6D:
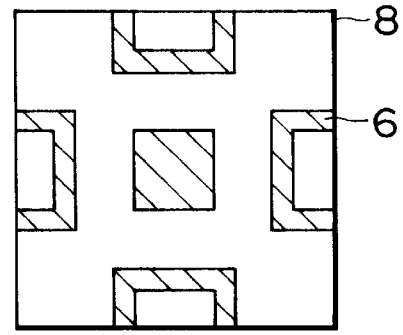

Preferable examples of the arrangement of spacer elements when viewed from the top (or projected on the connection plane 8 within the peripheral electrodes) to make the adhesive flow smoothly are triangles (FIG. 6A), L-shaped forms (FIG. 6B), semi-circular (arc) forms (FIG. 6C), and U-shaped forms (FIG. 6D). These elements of different shapes can be employed alone or in combination of two or more. Further, these shapes are arranged so as to direct individual angles (FIGS. 6A, 6B, 6C, 6E and 6F) and/or closed sides (FIG. 6D) to the center of the connection area. In addition, these shapes may preferably be formed separately in plural so as to further accelerate the flow of adhesive in the separated portions. Moreover, the spacer elements 6 may be arranged spokewise as shown in FIGS. 6A, 6B, 6E and 6F from the center of the connection area to the periphery for the reasons mentioned above. It is further preferable to provide a suitable roundness to angled portions so as to make the adhesive flow smoothly as shown in FIG. 6A.

In these cases, since the adhesive flows from the center of connection area to the periphery smoothly, bubbles are removed from the connected portion completely, resulting in making the contact between electrodes themselves or electrodes and electroconductive particles sufficient to give low connection resistance.

When the adhesive is pressed with heating at the time of connection, a part of the adhesive between the upper and lower electrodes flows to spaces between neighboring electrodes, followed by filling of the spaces and flowing a superfluous portion of the adhesive outside of the connection area of the chip. Thus, it is important in the present invention to provide the step of filling the spaces while flowing out. The spacer elements should be arranged so as not to prevent such outward flow.

When the cross-section of the spacer elements 6 has an uneven surface at the connection plane of electrodes as shown in FIG. 7, electroconductive particles and hard particles are easily maintained on the elements. When the uneven surface is made of, for example, grooves (FIG. 7A) or wavy stripes (FIGS. 7B and 7C), the adhesive flows more smoothly to conduct the present invention more preferably. In such cases, the depth of the hollow portion is preferably 0.5 μm or more, more preferably 1 μm to 20 μm. The depth of the hollow portion can also be expressed by an average roughness (JIS B0601, an average roughness from 10 points). Further, the cross-section of a trapezoid (FIG. 7D) and an inverted trapezoid (FIG. 7E) can also preferably improve the flow of adhesive.

In the above explanation, the spacer elements 6 are formed in the area within the peripheral electrodes of the semiconductor chip, but it is possible to form the spacer elements in the area of peripheral electrodes in admixture with the peripheral electrodes. Further, it is preferable to arrange the spacer elements 6 right-and-left and/or up-and-down symmetrically to the center of the connection area (FIGS. 6A–6F) so as to make the flow of adhesive uniform and to remove bubbles almost completely, and/or so as to maintain strength for bending and to obtain good connection.

As the material for the spacer elements 6, there can be used not only electroconductive materials exemplified as to the electrode 2 and the circuit 5, but also insulating materials exemplified as to the insulating layer 3. This means that it is sufficient that the spacer elements 6 can be subjected to the connection without bringing about a large deformation when pressed or pressed with heating at the time of connection. Thus, it is sufficient that the spacer elements have heat resistance equal to or higher than that of the substrate and the semiconductor chip mentioned above.

The height of spacer elements 6 in the present invention is almost the same as that of the projecting electrodes 7 (including circuit 5 in FIG. 1). This description requires a further explanation. In the case of FIG. 1 wherein the circuits 5 function as a projecting electrode, the height of spacer elements 6 is almost the same as that of the circuits 5. But in the cases of FIGS. 2 to 4, the height of spacer elements becomes a total height of the circuit 5 and the projecting electrode 7 (FIG. 2) or a height of the projecting electrode 7 from the plane of insulating layer 3 (FIGS. 3 and 4).

Figure 8A:
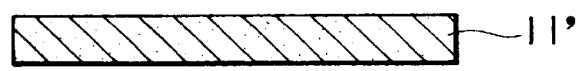
FIGS. 8A to 8E are cross-sectional views of various adhesive layers applicable to the present invention.

As the adhesive 11, it is possible to use an insulating adhesive (FIG. 8A) which directly binds the substrate and the chip and enables both electrodes to contact each other to give electric conductivity between the semiconductor chip and the wiring substrate. It is also possible to use an anisotropically electroconductive adhesive (FIG. 8B) which contains the electroconductive particles 12 in an amount sufficient to provide electric conductivity in only the thickness direction when pressed, that is, electroconductivity between both electrodes via electroconductive particles (applicable to FIGS. 1 to 4). The adhesive can be in the form of liquid or film. It is preferable to use a continuous film form adhesive having a constant thickness.

Figure 8B:

When the anisotropically electroconductive adhesive containing electroconductive particles as shown in FIG. 8B is used, it may not be necessary to form projecting electrodes 7 (see FIG. 1). This is advantageous and preferable from the viewpoints of a saving resources and production cost due to omission of step or steps. The content of the electroconductive particles sufficient to provide electroconductivity only in the thickness direction by pressing is about 0.1 to about 15% by volume, preferably 0.3 to 10% by volume based on the insulating adhesive. The content of electroconductive particles is decided depending on a connection pitch or connecting electrode area.

Figure 8C:
Figure 8D:
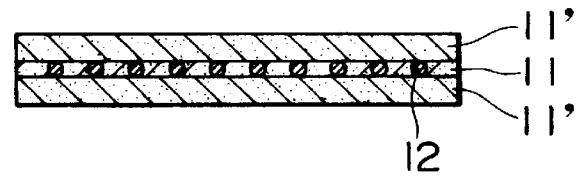
Figure 9:
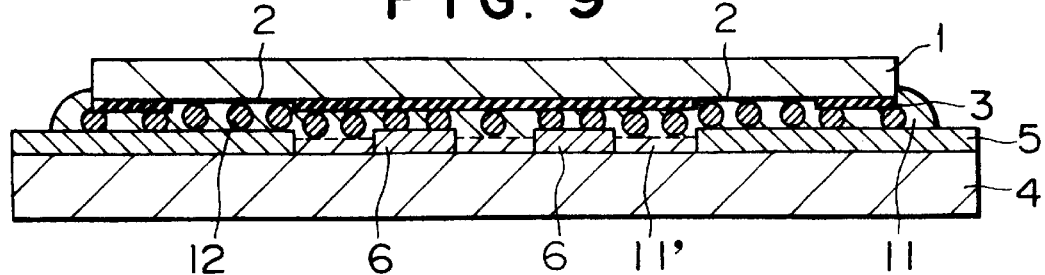
FIG. 9 is a schematic cross-sectional view of another embodiment of the semiconductor device according to the present invention.

It is also possible to use a laminated adhesive film comprising one or more insulating adhesives 11 and an isotropically electroconductive adhesive (FIGS. 8C and 8D). Such a laminated adhesive film is particularly useful for high pitch connection, since connection can be attained by separating a function of insulating properties and a function of electroconductivity. FIG. 9 shows a connected structure of a semiconductor chip and a substrate obtained by applying the adhesive shown in FIG. 8C (2 layered adhesive) to the structure of FIG. 1. As shown in FIG. 9, the adhesive on the side of the substrate 4 is composed mainly by the adhesive layer (11') containing no electroconductive particles, resulting in improving insulating properties.

As the insulating adhesive 11, there can be used conventional adhesives for electronic parts including thermoplastic resin adhesives. Among them, the use of a reactive adhesive is preferable. The reactive adhesive widely includes materials which can be cured by heat or light. Among them, the use of setting resin materials is preferable due to excellent heat resistance and moisture resistance after connection. Particularly, the use of epoxy adhesives is preferable due to curing in a short time, excellency in connection working and excellency in adhesiveness from the viewpoint of molecular structure.

The epoxy adhesives include, for example, a high molecular weight epoxy, a solid epoxy, a liquid epoxy, epoxy resins modified with urethane, polyester, acrylic rubber, acrylonitrile-butadiene rubber (NBR), nylon, etc. Needless to say, the epoxy adhesives may contain one or more curing agents, catalysts, coupling agents, fillers, etc.

As the curing agent for epoxy adhesives, it is preferable to use a latent curing agent in order to maintain storage stability of the connecting materials. The term "latent" means that a curing agent can be stored stably together with a reactive resin such as an epoxy resin at 30° C. or lower for 2 months or more, while curing of the reactive resin can be attained rapidly when heated.

As the electroconductive particles 12, there can be used particles of metals such as Au, Ag,.Pt, Ni, Cu, W, Sb, Sn, solder, etc. or carbon particles. These electroconductive particles can be used as core materials. Alternatively, non-electroconductive core material such as glass, ceramic, and high polymers such as plastics can be coated with such electroconductive materials to form an electroconductive layer on surfaces of non-electroconductive particles. It is also possible to use insulation film coated particles obtained by coating electroconductive particles 12 with an insulating layer, or to co-use electroconductive particles and insulating particles.

The upper limit of the particle size is decided so as to place at least one particle on a fine electrode, preferably 5 or more particles on the fine electrode. Concretely, the upper limit of the particle size is preferably 50 μm or less, more preferably 20 μm or less. On the other hand, the lower limit of the particle size is decided considering a larger size than the thickness of insulating layer 3 and applicability to uneven surface of electrodes. In order to prevent excessive coagulation of the particles, the lower limit is preferably 0.5 μm or more, more preferably 1 μm or more.

Among these electroconductive particles 12, those made of heat-fusible metal such as solder, and those obtained by forming an electroconductive layer on core particles made of high polymer such as plastic are preferable, since these electroconductive particles have good deformability against pressure with heating or pressure, increase the contact area with circuits at the time of lamination and improve reliability. When the electroconductive particles containing a high polymer as a core material are used, since a softened state can widely be controlled at a contact temperature due to showing no melting point in contrast to the case of using solder particles, it is particularly preferable to obtain connecting materials which can meet deviations of thickness or flat-ness of electrodes.

Further, when hard metal particles such as Ni and W particles, or particles having a number of projections on the surface are used as electroconductive particles, since the electroconductive particles pierce the electrodes and wiring pattern, a low connection resistance can preferably be obtained to improve reliability, even if an oxide film or a contaminated layer is present.

The electroconductive particles 12 preferably have an almost uniform particle size with a small particle size distribution. When the distribution of particle size is small, most particles are retained between the electrodes at the time of connection with pressing and a flowing-out amount is small. The distribution width of particle size is preferably ½ or less of the maximum particle size, taking unevenness of connection surface into consideration. For example, in the case of deformable particles obtained by coating an electroconductive layer on a core material made from a high polymer, there can be obtained particles having highly precise particle size of ±0.2 μm or less around the central value. Such particles are particularly preferable. In the case of hard metal particles, since these particles pierce the electrodes, the particle size distribution range can be relatively widened, for example, ½ or less of the maximum particle size.

Figure 8E:
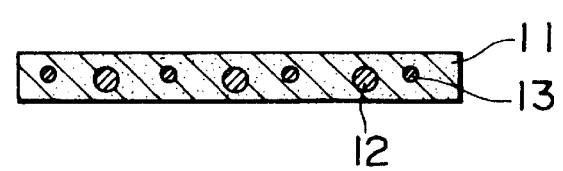

It is also possible to use a mixture of electroconductive particles and other hard particles (FIG. 8E). As the hard particles, these can be used other smaller electroconductive particles and the insulating particles which act as fillers. Such a mixture of particles shows a function of adjusting the gap between electrodes to be connected. Further, since the thickness of adhesive can be controlled at a predetermined value at the time of pressing with heating, it is possible to obtain the desired adhesive strength stably. In the case of adjusting the gap, it is preferable to make the particle size of hard particles smaller than that of electroconductive particles and to make the hardness of hard particles larger than that of electroconductive particles. When insulating particles are used as the hard particles, improvement in insulating properties for neighboring electrodes can also be obtained.

As the insulating particles, there can be used those made of inorganic materials such as glass, silica, ceramics, etc., or those made of organic materials such as polystyrene, epoxy resins, benzoguanamine resins, etc. The insulating particles can take any shapes such as spheres, fibers, etc. These insulating particles can be used singly or as a mixture thereof.

According to the present invention, even if the thickness of the semiconductor chip is as thin as 0.3 mm or less, since there are the spacer elements having almost the same height as that of the projecting electrodes in the area surrounded by the peripheral electrodes of the semiconductor chip, no warpage of the chip takes place even if the semiconductor chip and the wiring substrate via the adhesive are pressed or pressed with heating, resulting in remarkably improving connection reliability. Further, since the center portion of the semiconductor chip is hardly deformed, no residual stress remains after contact, resulting in providing flexural strength sufficient to carry thin electronic parts.

In addition, since the spacer elements are arranged in a shape which hardly retains bubbles in the interior by removing the bubbles from the center to end portions, no bubbles are present in the connected portion, and low connection resistance and high connection reliability can be obtained.

Further, when the height of the spacer elements on the wiring substrate is almost the same as that of circuit electrodes being projected on the wiring substrate in a more preferred embodiment, no special step for processing is necessary, since the plating and etching at the time of circuit processing can also be applied simultaneously, resulting in making the production cost low.

The present invention is illustrated by way of the following Examples.

EXAMPLE 1

(1) Semiconductor chip

As a semiconductor chip, there was used an IC chip for testing having a size of 2 mm×10 mm with a thickness of 100 μm, having a connection side covered with silicon nitride in 1.5 μm thick and having 200 so-called pads which are exposed aluminum electrodes with 100 μm square on peripheral portions on the four sides.

(2) Wiring substrate

On a glass-epoxy substrate of 0.1 mm thick, circuit terminals of copper foil of 15 μm thick were placed so as to correspond to the size of the electrode pads of the IC chip. In the area surrounded by the circuit terminals, spacer elements in a shape of regular triangle having a side of 500 μm long and having almost the same height as that of the circuit (or projecting electrode) were arranged as shown in FIG. 5D so as to assemble individual angles in the center of the area by etching. The area occupied by the spacer elements in the surrounded area was about 24%. The average roughness (JIS B0601) on the surface of the spacer elements was 1.4 μm.

(3) Anisotropically electroconductive film

A 30% ethyl acetate solution was obtained by mixing a high molecular weight epoxy resin (Mn=ca 25,000, phenoxy resin derived from bisphenol A) and a liquid bisphenol A type epoxy resin (epoxy equivalent 185) containing a latent curing agent encapsulated in micro capsules (a liquid bisphenol F type epoxy resin including micro capsules 30% by weight, the microcupsules having an average diameter of 2 μm and being imidazole derivative particles covered by polyurethane) in a weight ratio of 20/80. As electroconductive particles, polystyrene particles having a particle size of 8±0.2μm coated with Ni and Au (Ni: 0.2 μm thick/Au: 0.02 μm thick) were used. The electroconductive particles were mixed and dispersed in 5% by volume in the ethyl acetate. solution. The resulting dispersion was coated on a separator (silicone-treated polyethylene terephthalate film of 40 μm thick) using a roll water and dried at 110° C. for 20 minutes to give an anisotropically electroconductive film of 15 μm thick.

(4) Connection

The anisotropically electroconductive film was cut in a size of 3 mm×12 mm, which size was slightly larger than that of the semiconductor chip, and adhered to the wiring substrate. Then, the separator was peeled, and subjected to indexing of the pads of the semiconductor chip with the circuit terminals of the wiring substrate, followed by pressing at 170° C. under a pressure of 20 kgf/mm$^2$ for 15 second for the connection.

(5) Evaluation

Resistance between electrodes facing each other was evaluated as a connection resistance, and resistance between neighboring electrodes was evaluated as an insulation resistance.

The connection resistance was 0.1 Ω or less and the insulation resistance was 10$^8$ Ω or more. These values were hardly changed after treating at 85° C. and 85% RH for 1000 hours. This showed good reliability for a long period of time.

The obtained semiconductor device was cut and polished. The observation using a microscope showed that the cross-section was as shown in FIG. 1. Warpage of the semiconductor chip was hardly admitted and no bubble was found in the connected portion.

EXAMPLE 2

The process of Example 1 was repeated except for using as the wiring substrate a polyethylene terephthalate film of 250 μm thick having circuits of 15 μm thick and spacer elements (average roughness 2.3 μm) of 15 μm thick thereon using an Ag paste by a printing method.

The resulting connected structure had the same structure as shown in FIG. 1. No warpage of the semiconductor chip was admitted and a few bubbles were found, but good reliability for a long period of time was shown.

Since circuit was made of the Ag paste, the connection resistance was 1 Ω or less, which value was slightly higher than that of Example 1, and the insulation resistance was 10$^8$ Ω or more.

COMPARATIVE EXAMPLES 1 and 2

The processes of Examples 1 and 2 were repeated, respectively, except for not forming the spacer elements.

The connection resistance was as high as about 100 Ω at most in the case of using a glass-epoxy substrate (Comparative Example 1) and a film substrate (Comparative Example 2).

After being treated at 85° C. and 85% RH for 1000 hours, generation of opening (wire breaking) was observed. Further, a hollow-shaped warpage was found in the center of the semiconductor chips.

EXAMPLES 3 and 4

The processes of Examples 1 and 2 were repeated, respectively, except for using an anisotropically electroconductive adhesive film further containing 2% by volume of Ni particles having a particle size of 3±0.1 μm.

The resulting connected structures were evaluated in the same manner as described in Example 1. In both Examples (Example 3—glass-epoxy substrate, Example 4—film substrate), the thickness of connected portions was constant at near 3 μm which is the value of particle size of Ni particles. Further, the polystyrene particles were deformed so as to increase the contact area with electrodes, and connected to the electrodes, resulting in providing good reliability for a long period of time.

EXAMPLE 5

The process of Example 1 was repeated except for using dummy electrodes having a L-shaped form with a side of 0.5 mm long and 0.1 mm wide, and opening to the outside. The area occupied by the spacer elements in the surrounded area was about 40%.

In this case, no warpage of the semiconductor chip was admitted and good reliability for a long period of time was also shown. Since the spacer elements were arranged so as to remove bubbles from the center to the edges and bubbles were hardly retained in the interior, good connection without bubbles in the connected portion was obtained.

EXAMPLE 6

The process of Example 3 was repeated except for forming Au bumps (3 μm high from the silicon nitride surface) on the pads of the semiconductor chip.

In this case, good reliability for a long period time was obtained.

The spacer elements were formed only on the side of the wiring substrate (Ni layer of 3 μm thick is formed by electroless plating on the copper layer of 15 μm thick), not on the semiconductor chip, but the connection was conducted at near the thickness of 3 μm, which value is also the particle size of Ni particles, and was also good.

EXAMPLES 7 to 9 AND COMPARATIVE EXAMPLE 3

The process of Example 1 was repeated but the semiconductor chip and the shape of spacer elements on the wiring substrate were changed.

The semiconductor chip was changed in a size of 5 mm square with 0.05 mm thick (Example 7), a size of 5 mm square with 0.1 mm thick (Example 8), a size of 5 mm square with 0.3 mm thick (Example 9), and a size of 5 mm square and 0.6 mm thick (Comparative Example 3). There was also used a chip for testing, wherein the connection side was coated with a silicon nitride in 1.5 μm thick, and on 4 sides of peripheral portions, 100 exposed aluminum electrodes called pads with 100 μm square were formed.

The wiring substrate was the same as that used in Example 1, that is, on the glass-epoxy substrate of 0.1 mm thick, circuit terminals of 15 μm thick corresponding to the size of the electrode pads of the above-mentioned IC chip were formed. In the area surrounded by the circuit terminals, there were formed spacer elements having almost the same height as that of the circuit terminals (projecting electrodes) and an L-shaped form opened to outside with a width pitch of 1 mm (see FIG. 6B). The area occupied by the spacer elements in the surrounded area was about 60%.

In Examples 7 to 9, no warpage of the semiconductor chips was admitted, and good reliability for a long period of time was shown. No bubbles was found in the connected portions to give good connection.

When the wiring substrates connected with semiconductor chips were bent using a rod as an axis, electrical connection could be maintained until the radius of the rod was deformed to 10 mm (Example 7), 25 mm (Example 8), and 40 mm (Example 9). This means that the thinner the semiconductor chips become, the more flexibility can be obtained. These semiconductor devices are practically usable.

On the other hand, according to Comparative Example 3 wherein there was used a semiconductor chip having a conventional thickness (thicker than in Examples 8 to 9), since the semiconductor chip lacks flexibility, disconnection took place easily at 100 mm, and the flexural strength was poor.

EXAMPLE 10 to 12

Figure 6E:
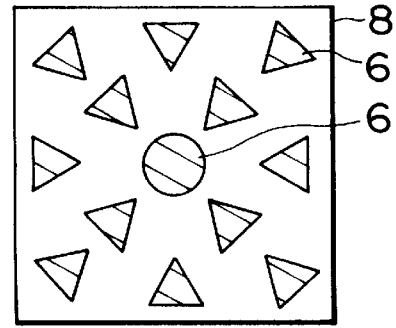
Figure 6F:
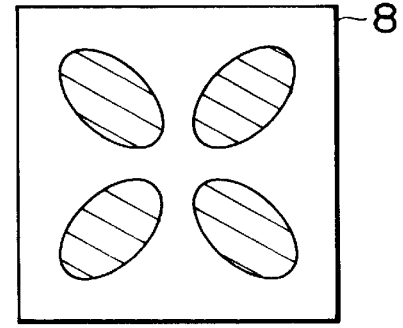
Figure 7A:
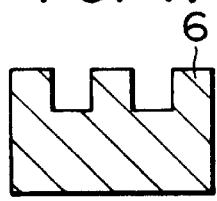
FIGS. 7A to 7E are schematic cross-sectional views of dummy electrodes according to embodiments of the present invention.
Figure 7B:
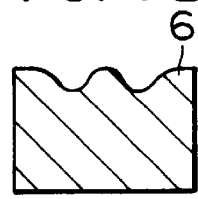
Figure 7C:
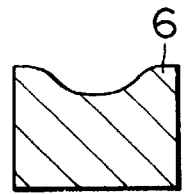
Figure 7D:
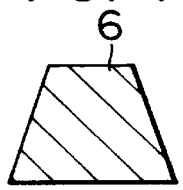
Figure 7E:
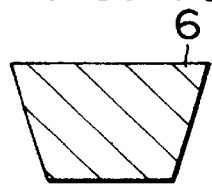

The process of Example 7 was repeated except for changing the shape of spacer elements to semi-circles (see FIG. 6C, Example 10), U-shaped form (see FIG. 6D, Example 11), and triangles in spokewise developement (see FIG. 6E, Example 12). The area occupied by the spacer elements in the surounded area was about 50% (Examples 10, 11 and 12).

The initial connection resistance was 0.15 Ω (Example 10), 0.022 Ω (Example 11), and 0.12 Ω (Example 12). No warpage of the semiconductor chips was admitted in Examples 10 to 12 and good reliability for a long period of time was also admitted in Examples 10 to 12. Further, in Examples 10 to 12, good connection without bubbles in the connected portions was admitted.

COMPARATIVE EXAMPLE 4

The precess of Example 7 was repeated except for using, as a spacer element, a square having a side of 3 mm long in the center of connection area.

As a result, the resulting connected structure showed a connection resistance of 12 Ω in average, which value was higher than the connection resistance of 0.010 Ω of Example 7 and varied highly compared with Example 7.

In the case of Comparative Example 4, since the adhesive was hardly removed at the time of connection, a number of bubbles were observed around the spacer element. Further, since the spacer element was formed in the center of the connection area and was only one in number, flexible connection was lowered to 50mm in the flexural test.

As mentioned above, according to the present invention, even if the semiconductor chip is as thin as 0.3 mm or less, since a plurality of spacer elements having almost the same height as that of projecting electrodes are present in the area surrounded by peripheral electrodes of the semiconductor chip and arranged so as to remove bubbles from the connected portions, flexible connection without causing warpage of the chip and excellent connection reliability can be obtained.

A semiconductor device comprising a semiconductor chip electrically connected to a wiring substrate and connected structure or assembly of the present invention can be applied to various information cards such as IC cards, prepaid cards, etc.

What is claimed is:

1. A semiconductor device comprising a semiconductor chip electrically connected to a wiring substrate, said chip having a thickness of 0.3 mm or less and a plurality of electrodes on a peripheral portion, the wiring substrate having a plurality of electrodes corresponding to the electrodes of the semiconductor chip, and an adhesive layer present between the semiconductor chip and the wiring substrate, said electrodes of at least one of the semiconductor chip and the wiring substrate being projected from an insulating plane to a predetermined height, a plurality of spacer elements having almost the same height as the predetermined height of the electrodes projecting from the insulating plane and having at least one shape selected from circles and polygons when seen from a plan view being present in an area surrounded by the electrodes on the peripheral portion of the semiconductor chip after connection.

2. The device according to claim 1, wherein the spacer elements have at least one shape, when viewed from the top, selected from triangles, L-shaped forms, semi-circles and U-shaped forms, and each angle and/or closed side thereof are arranged to direct to a center of a said area.

3. The device according to claim 1, wherein the spacer elements are arranged symmetrically to a center of said area.

4. The device according to claim 1, wherein the adhesive layer contains electroconductive particles to provide electroconductivity only in the thickness direction by pressing together with or without particles which have a particle size smaller than that of the electroconductive particles and a hardness larger than that of the electroconductive particles.

5. The device according to claim 1, wherein the spacer elements are arranged spokewise from the center of said area.

6. The device according to claim 1, wherein only the wiring substrate has the electrodes being projected and the spacer elements.

7. The device according to claim 1, wherein only the semiconductor chip has the electrodes being projected and the spacer elements.

8. The device according to claim 1, wherein both of the wiring substrate and the semiconductor chip have the electrodes being projected and the spacer elements.

9. The device according to claim 1, wherein one of the wiring substrate and the semiconductor chip has electrodes being projected and the other one has the spacer elements.

10. A wiring substrate comprising a substrate, a plurality of electrodes formed on the substrate and corresponding to electrodes on a peripheral portion of a semiconductor chip to be connected, and a plurality of spacer elements formed in an area surrounded by the electrodes on the substrate and having at least one shape selected from circles and polygons when viewed from the top, wherein at least one of the electrodes on the substrate and the electrodes on the semiconductor chip are projected from an insulating plane to a predetermined height and wherein the spacer elements have almost the same height as the predetermined height of the electrodes projecting from the insulating plane.

11. The wiring substrate according to claim 10, wherein the spacer elements have at least one shape, when viewed from the top, selected from triangles, L-shaped forms, semi-circles and U-shaped forms, and are arranged to direct adhesive flow smoothly from a center of said area to edge portions during connection of the substrate to the semiconductor chip.

12. The wiring substrate according to claim 10, wherein the spacer elements are arranged symmetrically to a center of said area.

13. The wiring substrate according to claim 10, wherein the spacer elements are arranged spokewise from the center of said area.

14. An electrically connected structure obtained by placing an anisotropically electroconductive adhesive containing electroconductive particles on a wiring substrate comprising a substrate, and formed thereon circuits including projecting electrodes projecting to a predetermined height and a plurality of spacer elements having almost the same height as the predetermined height of the projecting electrodes and having at least one shape selected from circles and polygons when viewed from the top in an area surrounded by the projecting electrodes, and placing a semiconductor chip comprising a support, electrodes formed on the support and an insulating layer formed on the electrodes so as to expose the electrodes at predetermined positions corresponding to the projecting electrodes on the wiring substrate and so as to face the exposed electrode of the chip to the projecting electrodes of the wiring substrate, followed by pressing.

15. An electrically connected structure obtained by placing an anisotropically electroconductive adhesive containing electroconductive particles on a wiring substrate comprising a substrate, and formed thereon circuits including electrodes and a plurality of spacer elements having at least one shape selected from circles and polygons when viewed from the top in an area surrounded by the electrodes, providing a semiconductor chip comprising a support, projecting electrodes formed on the support and an insulating layer so as to expose the projecting electrodes, projecting a predetermined height from the insulating layer, at predetermined positions corresponding to the electrodes on the wiring substrate, and placing the semiconductor chip so as to face the projecting electrodes of the chip to the electrodes of the wiring substrate, wherein the spacer elements have a height almost the same as the predetermined height of the projecting electrodes, followed by pressing.

16. An electrically connected structure according to claim 15, wherein the pressing is conducted with heating.

17. An electrically connected structure according to claim 15, wherein the pressing is conducted without heating.

18. An electrically connected structure according to claim 14, wherein the pressing is conducted with heating.

19. An electrically connected structure according to claim 14, wherein the pressing conducted without heating.

20. The wiring substrate according to claim 10, wherein said spacer elements have a heat resistance equal to or higher than that of said substrate and said semiconductor chip.

* * * * *